(12) United States Patent
Takada et al.

(10) Patent No.: US 7,944,125 B2
(45) Date of Patent: May 17, 2011

(54) SURFACE ACOUSTIC WAVE DEVICE

(75) Inventors: Norihiko Takada, Kanazawa (JP); Hayami Kudo, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/813,550

(22) Filed: Jun. 11, 2010

(65) Prior Publication Data
US 2010/0253182 A1    Oct. 7, 2010

Related U.S. Application Data

(63) Continuation of application No. PCT/JP2008/003640, filed on Dec. 8, 2008.

(30) Foreign Application Priority Data

Dec. 14, 2007  (JP) .................................. 2007-323641

(51) Int. Cl.
*H01L 41/04* (2006.01)
*H03H 9/25* (2006.01)

(52) U.S. Cl. ...................... 310/348; 310/313 R; 310/344
(58) Field of Classification Search .............. 310/313 R, 310/344, 348
See application file for complete search history.

(56) References Cited

U.S. PATENT DOCUMENTS

| | | | |
|---|---|---|---|
| 7,427,824 B2 * | 9/2008 | Iwamoto et al. | 310/344 |
| 7,583,161 B2 * | 9/2009 | Tanaka | 333/133 |
| 2002/0056897 A1 | 5/2002 | Yatsuda | |
| 2004/0145278 A1 * | 7/2004 | Iwamoto | 310/348 |
| 2006/0192462 A1 * | 8/2006 | Iwamoto et al. | 310/348 |
| 2006/0286718 A1 | 12/2006 | Ozaki | |
| 2006/0290238 A1 | 12/2006 | Ozaki | |
| 2008/0125662 A1 | 5/2008 | Aikawa et al. | |
| 2009/0309673 A1 * | 12/2009 | Iwamoto | 333/133 |
| 2010/0038992 A1 * | 2/2010 | Moriya et al. | 310/313 B |

FOREIGN PATENT DOCUMENTS

| | | | | |
|---|---|---|---|---|
| JP | 08-023259 A | | 1/1996 | |
| JP | 09-275324 A | | 10/1997 | |
| JP | 2000261284 A | * | 9/2000 | |
| JP | 2001-053178 A | | 2/2001 | |
| JP | 2003-037471 A | | 2/2003 | |

(Continued)

OTHER PUBLICATIONS

Official Communication issued in International Patent Application No. PCT/JP2008/003640, mailed on Mar. 10, 2009.

*Primary Examiner* — J. SanMartin
(74) *Attorney, Agent, or Firm* — Keating & Bennett, LLP

(57) ABSTRACT

A surface acoustic wave device causing less wear of a dicing blade and causing less drop in a dicing speed is manufactured from a mother laminate with high yield and high precision. The surface acoustic wave device is manufactured by dicing a piezoelectric wafer. The surface acoustic wave device includes a piezoelectric substrate resulting from dicing the piezoelectric wafer, IDT electrodes and pad electrodes located on a top surface of the piezoelectric substrate. A support layer having an opening opened to the IDT electrodes is provided. An outline edge of the support layer is inside an outline edge of the top surface of the piezoelectric substrate. A cover made of an insulating material is disposed on the support layer to close the opening of the support layer. In plan view, the outline edge of the cover is aligned with the outline edge of the piezoelectric substrate.

3 Claims, 6 Drawing Sheets

FOREIGN PATENT DOCUMENTS

| | | |
|---|---|---|
| JP | 2003-302525 A | 10/2003 |
| JP | 2004-186255 A | 7/2004 |
| JP | 2005-073180 A | 3/2005 |
| JP | 2006-352617 A | 12/2006 |
| JP | 2007-005948 A | 1/2007 |
| JP | 2008-135998 A | 6/2008 |

* cited by examiner

SURFACE ACOUSTIC WAVE DEVICE

BACKGROUND OF THE INVENTION

1. Field of the Invention

The present invention relates to a surface acoustic wave device manufactured by dicing a piezoelectric wafer and a method of manufacturing the surface acoustic wave device and, more specifically, to a surface acoustic wave device having a package structure with an outline edge of a diced piezoelectric substrate serving as an outline edge of the product, and a manufacturing method of the surface acoustic wave device.

2. Description of the Related Art

A package structure having an outline edge of a piezoelectric substrate serving as an outline edge of the product is implemented in a surface acoustic wave filter used in an RF stage of a cellular phone. This arrangement promotes miniaturization of the product as the surface acoustic wave device. The number of surface acoustic wave devices that can be produced from the piezoelectric wafer is also increased.

Japanese Unexamined Patent Application Publication No. 2003-37471 to be discussed below discloses an example of such a surface acoustic wave device.

FIG. 7 is a sectional front view of the surface acoustic wave device described in Japanese Unexamined Patent Application Publication No. 2003-37471. The surface acoustic wave device 101 includes a piezoelectric substrate 102. An electrode structure including an IDT electrode 103 is formed on one surface of the piezoelectric substrate 102. Pad electrodes 104 and 105 electrically connected to the IDT electrode 103 are formed on the one surface of the piezoelectric substrate 102. A resin layer 106 is arranged to be opposed to the piezoelectric substrate 102. A plurality of through-holes are formed in the resin layer 106 and internal circumferences of the through-holes are coated with conductors 107 and 108. Lower ends of the conductors 107 and 108 are electrically connected to external electrodes 109 and 110. Upper ends of the conductors 107 and 108 are electrically connected to pad electrodes 111 and 112.

A precision layer 113 is formed on a top surface of the resin layer 106. The precision layer 113 surrounds a region including the top ends of the conductors 107 and 108 and the pad electrodes 111 and 112. Resin layers 114 and 115 are arranged in a surrounding region of the pad electrodes 111 and 112 for height adjustment to be flush with the top surface of the precision layer 113.

Light curing resins 116 and 117 are used to bond together the resin layer 106 and the piezoelectric substrate 102 with the resin layer 106 and the piezoelectric substrate 102 opposed to each other as illustrated. In the bonding operation, the light curing resins 116 and 117 are arranged to surround a cavity S that causes a surface acoustic wave not to be impeded. Through conductors 118 and 119 are formed within the light curing resins 116 and 117. The through conductors 118 and 119 electrically conduct the pad electrodes 104 and 105 to the pad electrodes 111 and 112.

A large-scale piezoelectric wafer is prepared to manufacture the surface acoustic wave devices 101. In order to manufacture a plurality of surface acoustic wave devices 101 on the piezoelectric wafer, a plurality of electrode structures, each including the IDT electrode 103 and the pad electrodes 104 and 105, are formed. The resin layer 106 is then bonded to the piezoelectric wafer with a light curing resin interposed therebetween. A laminate body thus constructed is diced in the direction of thickness into a plurality of surface acoustic wave devices 101. A shape of the surface acoustic wave device 101 thus obtained is identical in plan view to the piezoelectric substrate 102.

In accordance with the method of manufacturing the surface acoustic wave device 101 described in Japanese Unexamined Patent Application Publication No. 2003-37471, a dicing operation is performed on a mother laminate after the mother laminate is produced. In the dicing operation, elements to be diced include not only the piezoelectric wafer but also the light curing resins 116 and 117, a synthetic resin layer, and the resin layer 106. To form the through conductors 118 and 119 through electroplating, a wiring pattern for supplying voltage to the plating is formed. Since such a wiring pattern straddles adjacent surface acoustic wave devices on the piezoelectric wafer, the wiring pattern is partially diced in the dicing operation.

Since cured adhesives, metals, and the like are cut by a dicing blade, the dicing blade is more subject to wear. When a plurality of surface acoustic wave devices are cut from the laminate, a relative large number of dicing operations are performed. The dicing blade is thus worn, leading to failure to perform a high precision dicing and a reduction in the dicing speed.

SUMMARY OF THE INVENTION

Preferred embodiments of the present invention provide a surface acoustic wave device and a method of manufacturing the surface acoustic wave device that is free of the above-described problems of the related art, causes less wear of a dicing blade, and is manufactured from a mother laminate with high yield and high precision.

A surface acoustic wave device according to a preferred embodiment of the present invention includes a piezoelectric substrate, an IDT electrode located on the piezoelectric substrate, a pad electrode electrically connected to the IDT electrode, a support layer made of an insulating material and including an opening opened to and surrounding the IDT electrode on the piezoelectric substrate with an outline edge of the support layer arranged inside an outline edge of a top surface of the piezoelectric substrate, and a cover made of an insulating material and arranged on the support layer to close the opening, and having an outline edge aligned with the outline edge of the piezoelectric substrate in plan view.

The surface acoustic wave device according to a preferred embodiment of the present invention in a particular aspect further includes a pad electrode located on the piezoelectric substrate and electrically connected to the IDT electrode, and an electrically conductive connection member electrically connected to the pad electrode, penetrating through the support layer and the cover, and extending to the top surface of the cover. Since the electrically conductive connection member extending through the support layer and the cover is provided, an electrical connection of the surface acoustic wave device to the outside can be formed on the top surface of the cover.

In the surface acoustic wave device according to another preferred embodiment of the present invention, the electrically conductive connection member includes an electrically conductive material portion that is preferably electroplated, and the surface acoustic wave device further includes a plating-operation wiring line extending on the piezoelectric substrate from the outline edge of the piezoelectric substrate to the pad electrode, and a coating layer made of an insulating material and coating a portion of the plating-operation wiring line not covered with the support layer. The electrically conductive connection member can be efficiently produced on the piezoelectric wafer through electroplating with voltage supplied via the plating-operation wiring line. The portion of the plating-operation wiring line not covered with the support layer is coated with the coating layer. This arrangement reliably prevents short-circuiting by cutting debris caused in the dicing of the plating-operation wiring line.

A manufacturing method of a surface acoustic wave device according to a further preferred embodiment of the present invention includes a step of preparing a piezoelectric wafer having on a top layer thereof a plurality of IDT electrodes of a plurality of surface acoustic wave devices to form the plurality of surface acoustic wave devices, a step of forming a support layer having a plurality of openings opened to and surrounding the IDT electrodes on the piezoelectric wafer with an outline edge of the support layer arranged inside and spaced apart from an outline edge of a top surface of each surface acoustic wave device, a step of forming a mother laminate by bonding a mother cover onto the piezoelectric wafer to close the openings of the support layer, and a step of forming each surface acoustic wave device by dicing the mother laminate along a dicing area along a border between the surface acoustic wave devices.

The manufacturing method of the surface acoustic wave device in another preferred embodiment of the present invention further includes a step of forming on the piezoelectric wafer a pad electrode electrically connected to each IDT electrode, in the formation of the support layer and the bonding of the cover, the support layer being formed and the cover being bonded in a manner such that a through-hole is opened through the support layer and the cover above the pad electrode, and a step of forming, subsequent to the bonding of the cover, an electrically conductive material portion in the through-hole through electroplating, the electrically conductive material portion being connected to the pad electrode through a plating operation. The electrically conductive material portion is efficiently produced through electroplating after the bonding of the cover.

The manufacturing method of the surface acoustic wave device in yet another preferred embodiment of the present invention further includes a step of forming a plating-operation wiring line electrically connected to the pad electrode, wherein an end portion of the plating-operation wiring line is diced in the dicing of the laminate. Although the plating-operation wiring line is finally diced in the dicing of the laminate, the electrically conductive material portions of a large number of surface acoustic wave devices are efficiently formed on the piezoelectric wafer through electroplating, prior to the dicing of the laminate.

The manufacturing method of the surface acoustic wave device in yet another preferred embodiment of the present invention further includes a step of supplying voltage through the plating-operation wiring line to form the electrically conductive material portion through electroplating. With voltage supplied through the plating-operation wiring line, the electrically conductive material portion is efficiently formed through electroplating.

The manufacturing method of the surface acoustic wave device in yet another preferred embodiment of the present invention further includes a step of forming a coating layer made of an insulating material and coating the plating-operation wiring line, wherein electroplating is performed after the coating layer is formed. This arrangement reliably prevents short-circuiting by cutting debris caused in the dicing of the plating-operation wiring line.

The outline edge of the support layer is inside the outline edge of the top layer of the piezoelectric substrate in the surface acoustic wave device according to a preferred embodiment of the present invention. This arrangement prevents the support layer from being diced when the laminate of the piezoelectric wafer and the mother cover is diced to the surface acoustic wave device. A wear rate of a dicing blade is low and production yield in the dicing operation is effectively increased.

The surface acoustic wave device according to one preferred embodiment of the present invention is manufactured in accordance with the manufacturing method according to another preferred embodiment of the present invention. The wear rate of the dicing blade is low, and a reduction in the dicing speed is small. The production yield of the surface acoustic wave device is thus increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention is clarified by describing the specific preferred embodiments of the present invention with reference to the drawings.

A surface acoustic wave device and a method of manufacturing the surface acoustic wave device according to various preferred embodiments of the present invention are described below with reference to FIGS. 1-3.

In accordance with the manufacturing method of the present preferred embodiment, a piezoelectric wafer is prepared for producing a large number of surface acoustic wave devices. The piezoelectric material of the piezoelectric wafer is not limited to any particular piezoelectric material. For example, a piezoelectric monocrystal of or a piezoelectric ceramic of $LiTaO_3$, $LiNbO_3$, or quartz may be used.

Electrodes including an IDT electrode are formed on one surface of the piezoelectric wafer to produce a plurality of surface acoustic wave devices. FIG. 2 is a diagrammatic plan view illustrating an electrode structure in a region of the piezoelectric wafer where one surface acoustic wave device is manufactured. In accordance with the present preferred embodiment, an IDT electrode 1, IDT electrodes 2 and 3 arranged on both sides of the IDT electrode 1 in a surface acoustic wave traveling direction, and pad electrodes 4-7 are provided. The IDT electrode 1 includes first and second partitioned IDTs 1a and 1b that are formed by partitioning bus bars. The partitioned IDTs 1a and 1b are respectively connected to pad electrodes 4 and 5. Ends of the IDT electrodes 2 and 3 are electrically connected to the pad electrodes 6 and 7. Grating type reflectors, though not illustrated, are arranged on both sides of a region in the surface acoustic wave traveling direction where the IDT electrodes 1-3 are formed.

Figure 2:
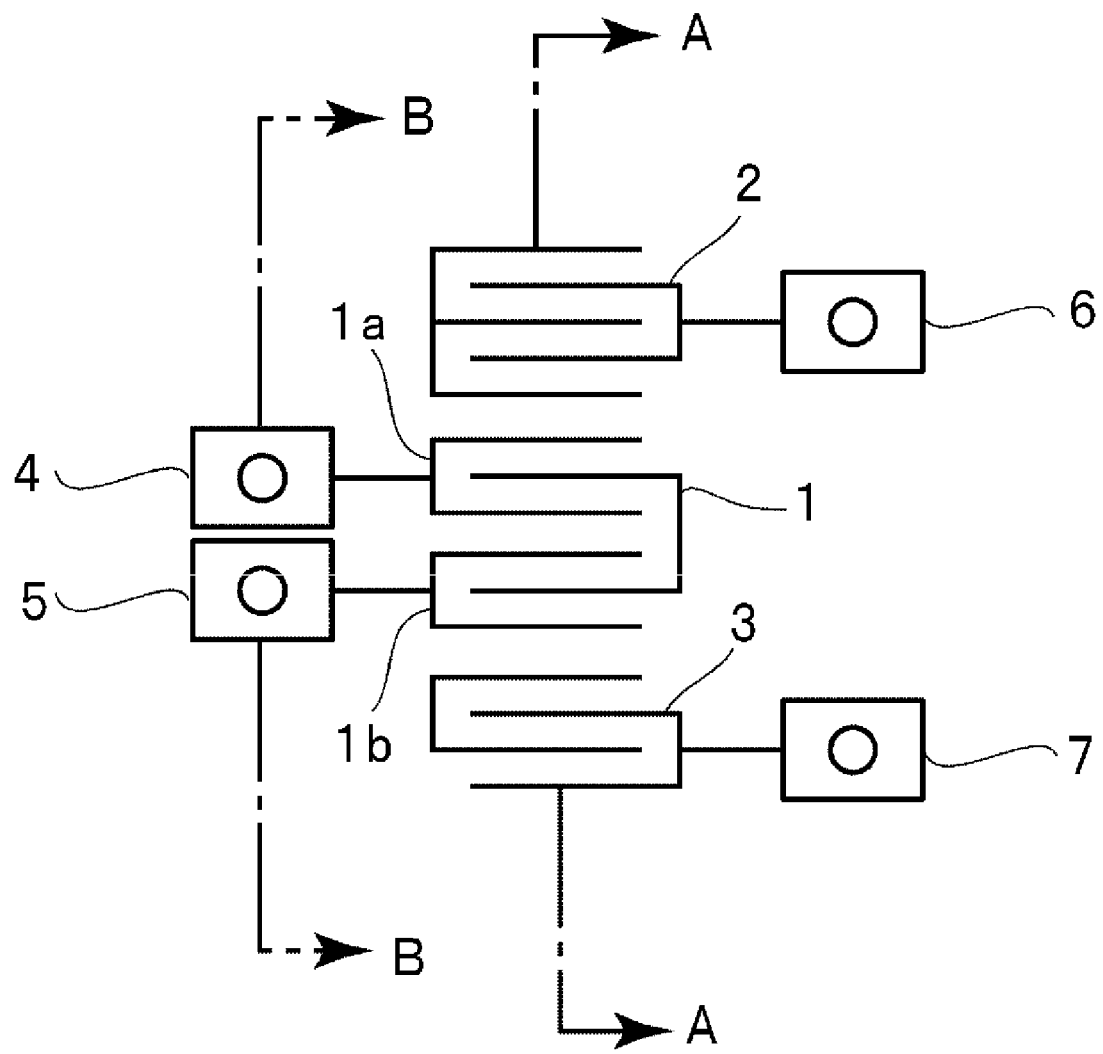
FIG. 2 is a diagrammatic plan view illustrating an electrode structure of one surface acoustic wave device formed on a piezoelectric wafer.

The electrode structure of the surface acoustic wave device is not limited to the structure illustrated in FIG. 2.

Figure 3:
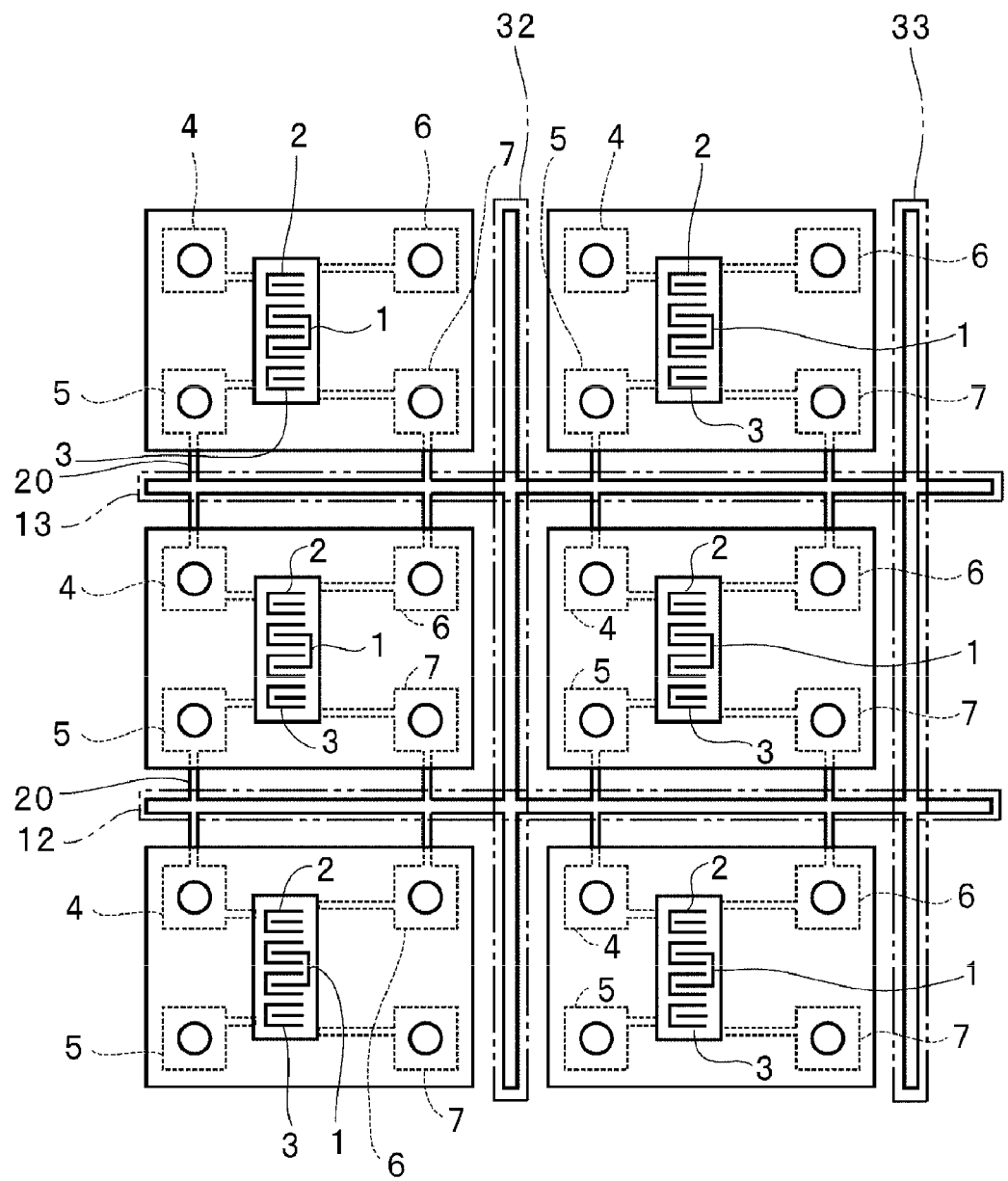
FIG. 3 is a diagrammatic plan view illustrating a plurality of electrode structures, a support layer and a cover formed on the piezoelectric wafer through a manufacturing method of one preferred embodiment of the present invention.

A plurality of electrode structures of the surface acoustic wave devices are provided on the piezoelectric wafer as diagrammatically illustrated in FIG. 3. In accordance with the present preferred embodiment, a plurality of electrode structures defining surface acoustic wave devices are arranged in a matrix configuration as illustrated in FIG. 3. Alternatively, a plurality of electrode structures may be arranged in a non-matrix pattern.

Referring to FIG. 3, a region including the IDT electrodes 1-3, out of the electrode structure, is diagrammatically illustrated. Wiring patterns of the pad electrodes 4-7 and wiring patterns connecting the pad electrodes 4-7 to the IDT electrode 1 or the IDT electrodes 2 and 3 are illustrated in a state covered with a cover to be discussed later.

The electrode structure forming each surface acoustic wave device is preferably formed by depositing a metal layer such as of Ag, Cu, Al, Ti, Pt, NiCr, or an Ag—Pd alloy, and then patterning the metal layer. The formation method of the electrode structure is not limited to any particular method. Alternatively, the electrode structure including the IDT electrodes 1-3 may be manufactured of a metal laminate including a plurality of metal layers.

Figure 1A:
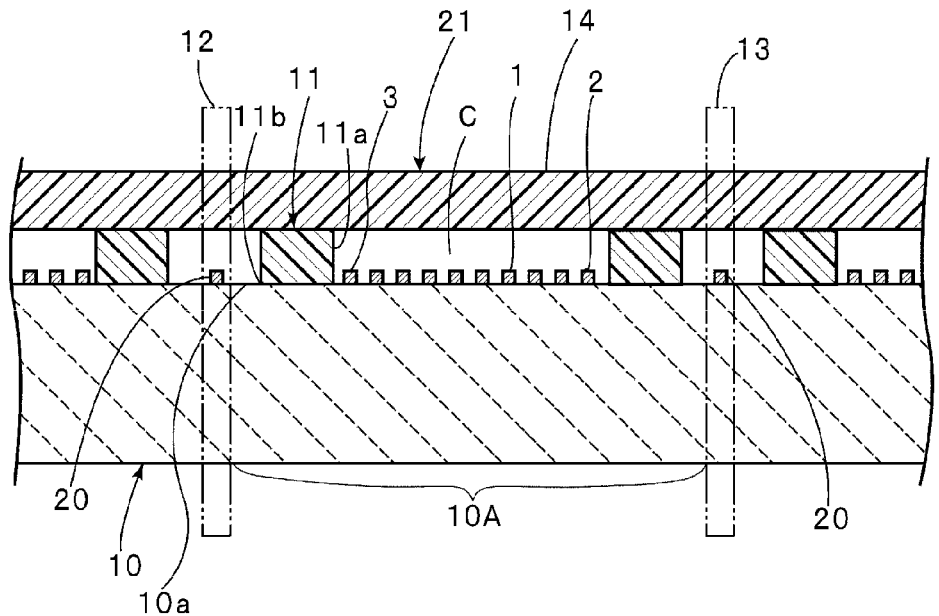
FIGS. 1A and 1B are sectional views, illustrating a manufacturing method of a surface acoustic wave device in accordance with one preferred embodiment of the present invention, wherein the section views are taken along lines A-A and line B-B in FIG. 2.

A support layer 11 is formed as illustrated in FIG. 1A. In accordance with the present preferred embodiment, the support layer 11 is manufactured by entirely applying a photosensitive polyimide based resin on a top surface 10a of a piezoelectric wafer 10 and patterning the photosensitive polyimide based resin through a photolithographic process. Alternatively, the support layer 11 may be manufactured of another synthetic resin.

The support layer 11 is patterned to form a cavity C that is intended not to impede traveling of a surface acoustic wave. The support layer 11 includes an opening 11a surrounding a region of the IDT electrodes 1-3. An outline edge 11b of the support layer 11 is inside an outline edge of the piezoelectric substrate 10A of the finished surface acoustic wave device. Referring to FIG. 3, horizontally extending dicing areas 12 and 13 and vertically extending dicing areas 32 and 33 are cut away in the dicing operation. A region surrounded by the dicing areas 12, 13, 32, and 33 is each section forming each surface acoustic wave device. The outline edge 11b of the support layer 11 is inside an outline edge of each surface acoustic wave device, i.e., the outline edge of the finished piezoelectric substrate 10A.

In accordance with the present preferred embodiment, a cover 14 is formed through a thermal lamination process after the support layer 11 is produced. The cover 14 of this preferred embodiment is made of a non-photosensitive epoxy based resin. Alternatively, the cover 14 may be made of a material selected from a variety of insulating materials including a synthetic resin other than the non-photosensitive epoxy based resin.

Figure 1B:
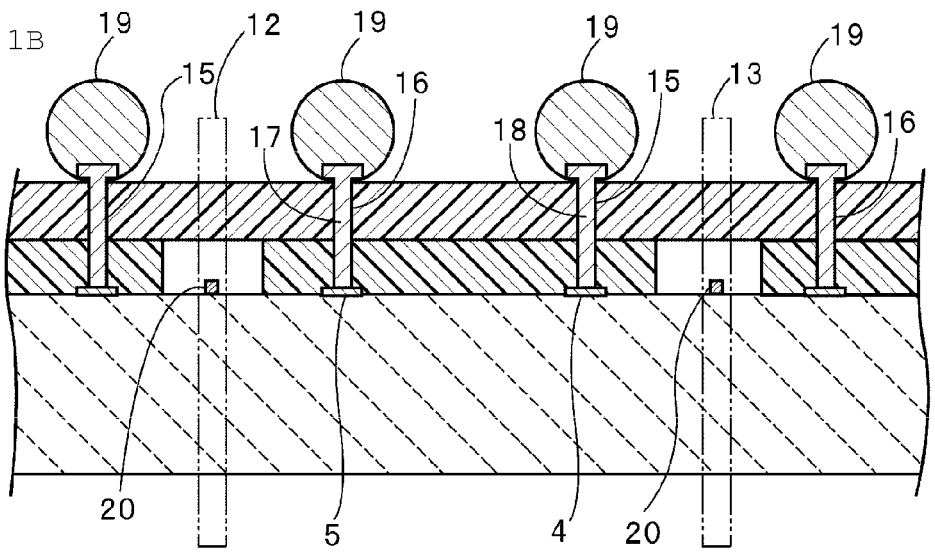

Referring to FIGS. 1A and 1B, the opening 11a of the support layer 11 and a surrounding space outside the outline edge 11b of the support layer 11 are covered with the cover 14.

Through-holes 15 and 16 illustrated in FIG. 1B are formed preferably through irradiation of a laser beam. The through-holes 15 and 16 penetrate from the top surface the pad electrodes 4 and 5 through the support layer 11 and the cover 14 and extends to the top surface of the cover 14.

The through-holes 15 and 16 are formed such that the top surfaces of the pad electrodes 4 and 5 are exposed.

Electrically conductive connection members 17 and 18 are formed through electroplating to coat the inner circumferences of the through-holes 15 and 16 or to fill the through-holes 15 and 16. The electrically conductive connection members 17 and 18 are formed by electroplating an appropriate metal such as Cu, Ni, or the like. Preferably, an Au layer is further deposited to a thickness of about 0.5 μm, for example, onto the surface of the electrically conductive connection members 17 and 18 through electroplating or the like.

The electrically conductive connection members 17 and 18 are an electrically conductive material portion formed through electroplating in accordance with a preferred embodiment of the present invention. In this case, the electrically conductive connection members 17 and 18 may include an electrically conductive film coating the inner circumferences of the through-holes 15 and 16 and a conductor filling the electrically conductive film coated holes. In such a case, the electrically conductive film may be the electrically conductive material portion formed through electroplating, and the conductor filling the through hole may be deposited through a method other than electroplating.

More specifically, the entire portion of the electrically conductive connection member is not necessarily the electrically conductive material portion formed through electroplating.

Solder paste containing an Sn—Ag—Cu based alloy as a main content is printed on the electrically conductive connection members 17 and 18. The solder paste may be printed using a metal mask such that the solder paste is to be electrically connected to the top portion of each the electrically conductive connection members 17 and 18. The solder paste is then heated to a melting temperature thereof, for example, to about 260° C. Solder is thus solidified onto the electrically conductive connection members 17 and 18. Flux is then removed with flux cleaning agent. In this way, solder bumps 19 and 19 in a spherical shape are formed as illustrated in FIG. 1B.

Spherical bumps of a different metal may be formed in place of the solder bumps 19 and 19.

Electroplating of the electrically conductive connection members 17 and 18 may be performed by supplying voltage to the pad electrodes 4 and 5. Referring to FIG. 3, the pad electrodes 4 and 5 are electrically connected to the pad electrodes 6 and 7 via the plating-operation wiring line 20. By applying voltage through the plating-operation wiring lines 20, the electrically conductive connection members 17 and 18 can be easily formed at a time in a large number of regions of surface acoustic wave devices on the piezoelectric wafer 10.

A dicing operation is performed along the dicing areas 12, 13, 32, and 33. The dicing areas 12 and 13 and the dicing areas 32 and 33 are removed in the dicing operation. A laminate body including the piezoelectric wafer 10, the support layer 11, and the cover 14 is thus diced, forming each surface acoustic wave device.

A portion denoted by the piezoelectric substrate 10A of FIG. 1A is a single surface acoustic wave device. An obtained surface acoustic device 21 includes the support layer 11 deposited on the piezoelectric substrate 10A that is obtained by dicing the piezoelectric wafer 10. The diced cover 14 is laminated on the support layer 11. In the dicing operation, the piezoelectric wafer 10 and the cover 14 are diced with a dicing blade, but the support layer 11 is not diced. The workload on the dicing blade is light and wear of the dicing blade is reduced.

The dicing speed may be increased. The dicing speed may be discussed with reference to a comparative example illustrated in FIG. 4 and the related art illustrated in FIG. 8.

Figure 8:
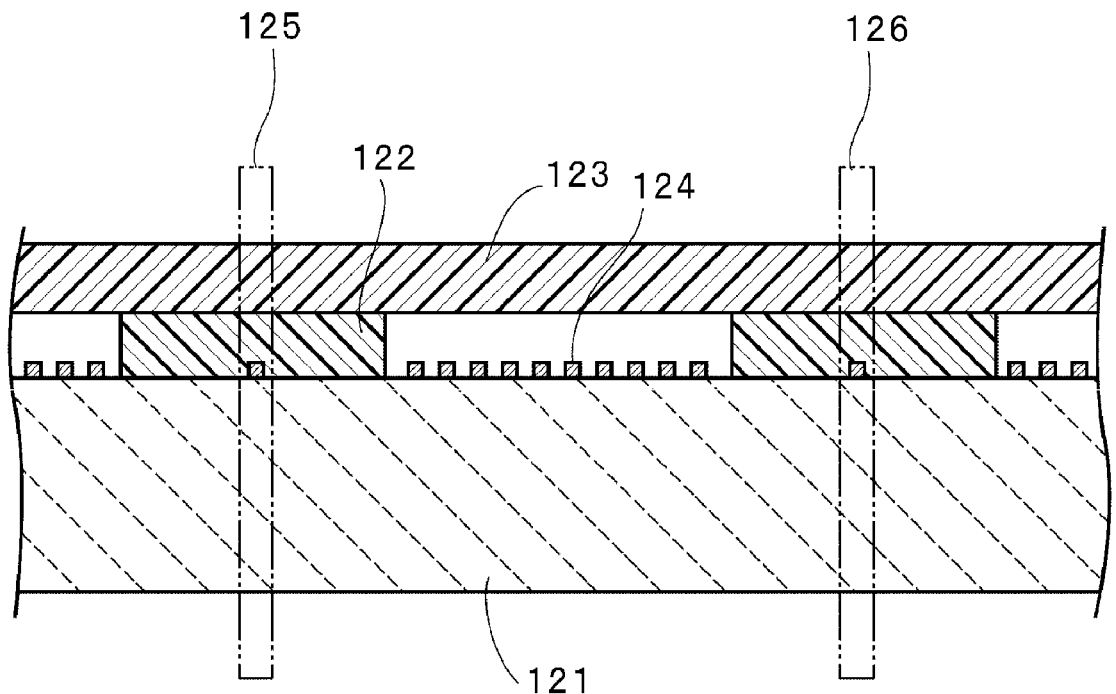
FIG. 8 is a partially cutaway sectional front view illustrating a problem of a manufacturing method of the known surface acoustic wave device.

In the structure of FIG. 8, a support layer 122 and a cover 123 are laminated on a top surface of a piezoelectric wafer 121. The support layer 122 includes an opening that surrounds a formation region of an IDT electrode 124. The IDT electrode 124 extends to dicing areas 125 and 126. The cover 123 also extends to the dicing areas. The dicing blade thus dices all of the piezoelectric wafer 121, the support layer 122, and the cover 123 in the dicing operation. The workload of the dicing blade is large. The dicing blade tends to be worn soon. It is also difficult to increase the dicing speed.

Figure 4:
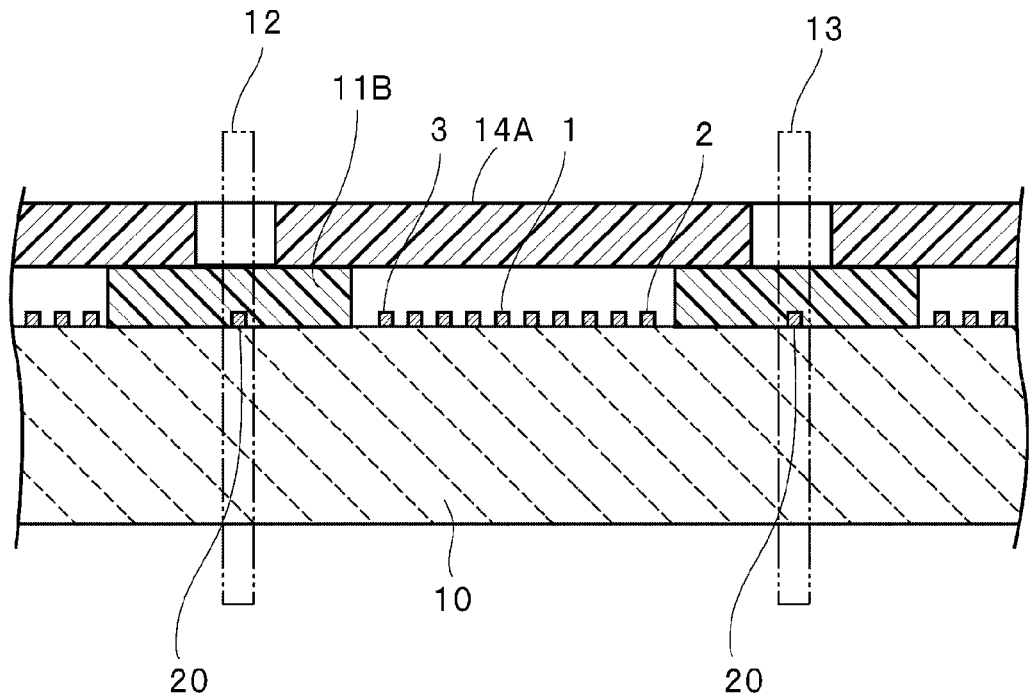
FIG. 4 is a partially cutaway sectional front view illustrating a problem of a comparative manufacturing method.

In contrast, in the comparative example illustrated in FIG. 4, the support layer 11B may extend to the dicing areas 12 and 13 and the cover 14A may be formed so as not to extend to the dicing areas 12 and 13. In such a case, the piezoelectric wafer 10 and the support layer 11B are diced with the dicing blade in the dicing operation. Peeling tends to occur in the interface between the piezoelectric wafer 10 and the support layer 11B in the dicing operation. When the electrically conductive material portion is formed through wet process plating with voltage applied via the plating-operation wiring line 20, a plating solution tends to intrude through the interface. The formation of the electrically conductive connection members 17 and 18 may be unsuccessful, or the finished surface acoustic wave device may suffer from a drop in humidity resistance and environmental resistance.

In accordance with the manufacturing method of the present preferred embodiment, in contrast, peeling in the interface between the support layer 11 and the piezoelectric wafer 10 is unlikely. No plating solution is likely to intrude even if the electrically conductive connection members 17 and 18 are formed through wet process plating with voltage applied via the plating-operation wiring line 20. A highly reliable surface acoustic wave device thus results. The electrically conductive connection members 17 and 18 are thus reliably produced.

Figure 5:
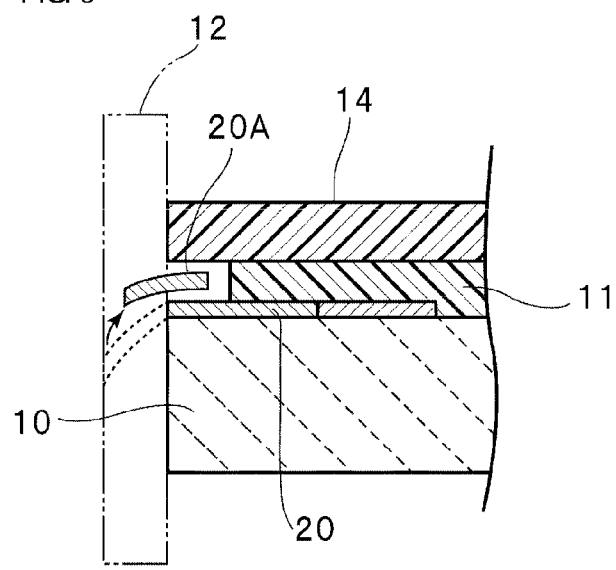
FIG. 5 is a sectional front view diagrammatically illustrating an end portion of the surface acoustic wave device diced from the piezoelectric wafer.

The plating-operation wiring line 20 is also diced in the dicing operation. As illustrated in FIG. 5, metal debris 20A can be caused in the cut section of the plating-operation wiring line 20. If the metal debris 20A electrically connects adjacent plating-operation wiring lines 20 and 20, a short circuit failure can take place. For example, if the metal debris 20A lands, straddling a plating-operation wiring line electrically connected to the pad electrode 4 and a plating-operation wiring line electrically connected to the pad electrode 5, a short circuit failure takes place in the finished surface acoustic wave device.

Figure 6:
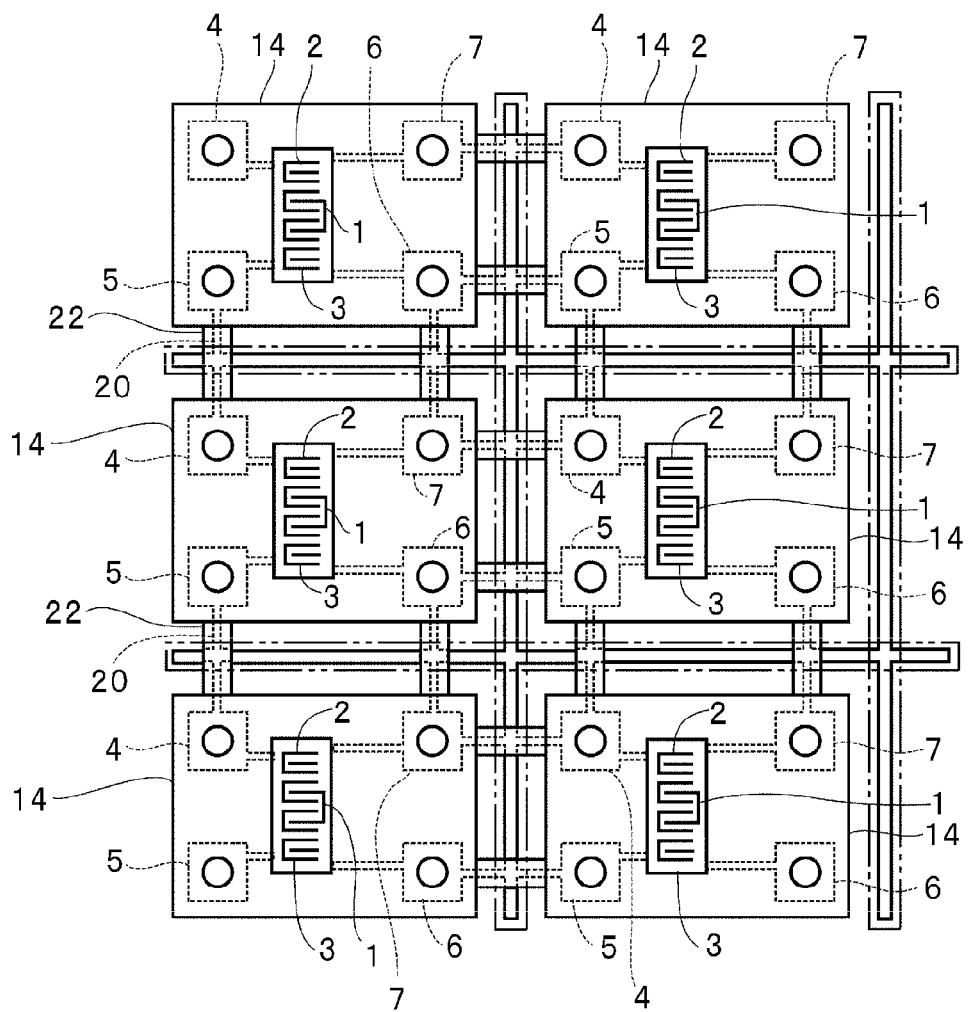
FIG. 6 is a diagrammatic plan view illustrating a modification of the manufacturing method of the preferred embodiment illustrated in FIG. 3.
Figure 7:
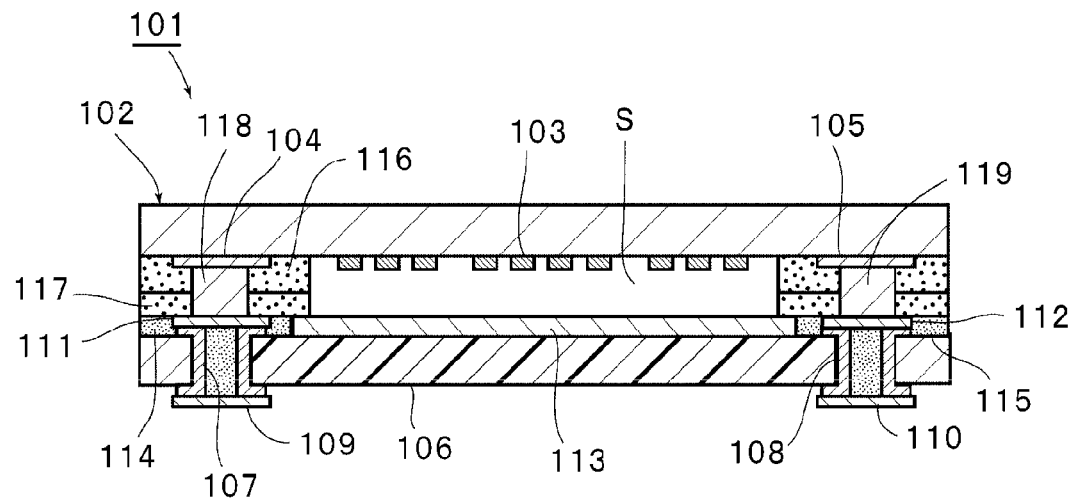
FIG. 7 is a sectional front view illustrating a known surface acoustic wave device.

To prevent such a short circuit failure, a coating layer 22 is preferably formed to coat the plating-operation wiring line 20 as illustrated in a diagrammatic plan view in FIG. 6. Preferably, the coating layer 22 is formed to coat entirely the plating-operation wiring line 20. In order to prevent short circuiting between two adjacent wiring lines, at least one coating layer 22 is simply formed to coat one of the plating-operation wiring lines connected to the adjacent pad electrodes 4 and 5. It is not necessary that the coating layer 22 extends to within the dicing areas 12, 13, 32, and 33. The coating layer 22 may be made of any appropriate insulating material. Such an insulating material may be the same synthetic resin as the resin forming the support layer 11. The support layer 11 and the coating layer 22 are preferably made of the same material such that the coating layer 22 is formed at the same process step as that of the support layer 11. The short circuit failure is thus reliably prevented without an increase in the number of process steps.

The use of the coating layer 22 reliably prevents the plating solution from intruding internally into the surface acoustic wave device in the electroplating process.

In the above-described preferred embodiments, the IDT electrode preferably is electrically connected to the electrically conductive connection members 17 and 18 extending to the top surface of the cover. The present invention is not limited to this structure for electrically connecting the IDT electrode to the outside.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device comprising:
    a piezoelectric substrate;
    an IDT electrode located on the piezoelectric substrate;
    a pad electrode electrically connected to the IDT electrode;
    a support layer made of an insulating material and including an opening opened to and surrounding the IDT electrode on the piezoelectric substrate with an outline edge of the support layer arranged inside an outline edge of a top surface of the piezoelectric substrate; and
    a cover made of an insulating material and arranged on the support layer to close the opening, and having an outline edge aligned with the outline edge of the piezoelectric substrate in plan view.

2. The surface acoustic wave device according to claim 1, further comprising a pad electrode located on the piezoelectric substrate and electrically connected to the IDT electrode, and
    an electrically conductive connection member electrically connected to the pad electrode, penetrating through the support layer and the cover, and extending to the top surface of the cover.

3. The surface acoustic wave device according to claim 2, wherein the electrically conductive connection member comprises an electrically conductive material portion made of an electroplated material, and wherein the surface acoustic wave device further comprises:
    a plating-operation wiring line extending on the piezoelectric substrate from the outline edge of the piezoelectric substrate to the pad electrode; and
    a coating layer made of an insulating material and arranged to coat a portion of the plating-operation wiring line not covered with the support layer.

* * * * *